US008912554B2

(12) United States Patent
Schubert et al.

(10) Patent No.: US 8,912,554 B2
(45) Date of Patent: Dec. 16, 2014

(54) LONG WAVELENGTH LIGHT EMITTING DEVICE WITH PHOTOLUMINESCENCE EMISSION AND HIGH QUANTUM EFFICIENCY

(75) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 13/156,207

(22) Filed: Jun. 8, 2011

(65) Prior Publication Data

US 2012/0313074 A1 Dec. 13, 2012

(51) Int. Cl.
*H01L 29/20* (2006.01)
*H01L 33/50* (2010.01)
*H01L 33/08* (2010.01)
*H01L 33/40* (2010.01)

(52) U.S. Cl.
CPC .............. *H01L 33/502* (2013.01); *H01L 33/08* (2013.01); *H01L 33/405* (2013.01)
USPC .......... 257/89; 257/13; 257/79; 257/E33.061; 438/2; 438/35; 438/29

(58) Field of Classification Search
CPC ... H01L 33/502; H01L 25/167; H01L 33/106; H01L 31/04
USPC .................. 257/79, 89, 13, 14, 105, E33.061; 438/2, 29, 35
See application file for complete search history.

(56) References Cited

U.S. PATENT DOCUMENTS 6,203,180 B1 * 3/2001 Fleischmann ................. 362/471
6,509,651 B1 1/2003 Matsubara et al.
6,730,943 B2 5/2004 Massies et al.
(Continued)

FOREIGN PATENT DOCUMENTS

JP 2003037291 A 2/2003
JP 2003197969 A 7/2003
TW 200719491 A 11/1994
TW 497277 B 8/2002

OTHER PUBLICATIONS

Heterostructures and Quantum Devices, W. R. Frensley and N. G. Einspruch editors,—Heterostructure and Quantum Well Physics—p. 15 a volume of VLSI Electronics: Microstructure Science. (Academic Press, San Diego) Publication date: Mar. 25, 1994.*
International Search Report and Written Opinion issued Dec. 12, 2012 in International Application No. PCT/US2012/040268, 7 pages.

(Continued)

*Primary Examiner* — Marcos D. Pizarro
*Assistant Examiner* — Cesar Lopez
(74) *Attorney, Agent, or Firm* — Perkins Coie LLP

(57) ABSTRACT

Various embodiments of light emitting devices with high quantum efficiencies are described herein. In one embodiment, a light emitting device includes a first contact, a second contact spaced apart from the first contact, and a first active region between the first and second contacts. The first active region is configured to produce a first emission via electroluminescence when a voltage is applied between the first and second contacts, and the first emission having a first center wavelength. The light emitting device also includes a second active region spaced apart from the first active region. The second active region is configured to absorb at least a portion of the first emission and produce a second emission via photoluminescence, and the second emission having a second center wavelength longer than the first center wavelength.

12 Claims, 2 Drawing Sheets

(56) References Cited

U.S. PATENT DOCUMENTS

| | | |
|---|---|---|
| 7,825,574 B2 | 11/2010 | Brunner et al. |
| 7,848,379 B2 | 12/2010 | Shur et al. |
| 2002/0030197 A1* | 3/2002 | Sugawara et al. ............. 257/103 |
| 2003/0006430 A1* | 1/2003 | Shibata et al. ................ 257/200 |
| 2004/0129944 A1 | 7/2004 | Chen |
| 2005/0230693 A1* | 10/2005 | Chen ............................... 257/89 |
| 2006/0145137 A1 | 7/2006 | Wang et al. |
| 2010/0025712 A1 | 2/2010 | Weyers et al. |

OTHER PUBLICATIONS

Yang, Y. et al., Rapid efficiency roll-off in high-quality green light-emitting diodes on freestanding GaN substrates, Appl. Phys. Lett., vol. 94, No. 4, pp. 041117-1-041117-3, Jan. 2009.

Kumakura, K. et al., Minority carrier diffusion length in GaN: Dislocation density and doping concentration dependence, Applied Physics Letters 86, 052105 (2005).

Office Action issued May 5, 2014 in Taiwan Patent Application No. 101120805, 15 pages.

* cited by examiner

LONG WAVELENGTH LIGHT EMITTING DEVICE WITH PHOTOLUMINESCENCE EMISSION AND HIGH QUANTUM EFFICIENCY

TECHNICAL FIELD

The present disclosure is related to long wavelength light emitting devices with high quantum efficiencies.

BACKGROUND

Light emitting diodes ("LEDs") and other types of light emitting devices are widely used for background illumination in electronic devices and for signage, indoor lighting, outdoor lighting, and other types of general illumination. The efficiency of conventional light emitting devices generally varies with different wavelengths. For example, gallium nitride (GaN)/indium gallium nitride (InGaN) based LEDs are substantially less efficient in the green wavelength range than in the blue or violet wavelength ranges at typically current densities. Accordingly, several improvements in light emitting devices to efficiently emit light at wavelengths longer than the blue or violet wavelength ranges may be desirable.

DETAILED DESCRIPTION

Various embodiments of light emitting devices with high quantum efficiencies are described below. As used hereinafter, the term "light emitting device" generally refers to LEDs, laser diodes, and/or other suitable sources of illumination other than electrical filaments, a plasma, or a gas. The term "quantum efficiency" generally refers to a ratio of a number of photons produced to a number of electrons injected. A person skilled in the relevant art will also understand that the technology may have additional embodiments, and that the technology may be practiced without several of the details of the embodiments described below with reference to FIGS. 1-4.

As discussed above in the background section, light emitting devices can have varying efficiencies emitting in different wavelength ranges. It has been recognized that GaN/InGaN based LEDs are substantially less efficient in relatively longer wavelength ranges (e.g., green) than in shorter wavelength ranges (e.g., blue or violet). For example, Model No. EZ1000 produced by Cree, Inc. of Durham, N.C. emits light at 450 nm and has 380 mW output power at a 350 mA drive current. In contrast, other LEDs emit light at 530 nm and have only 150 mW output power. The corresponding quantum efficiencies of the 450 nm LEDs and 530 nm LEDs are 39.4% and 18.3%, respectively.

Figure 1:
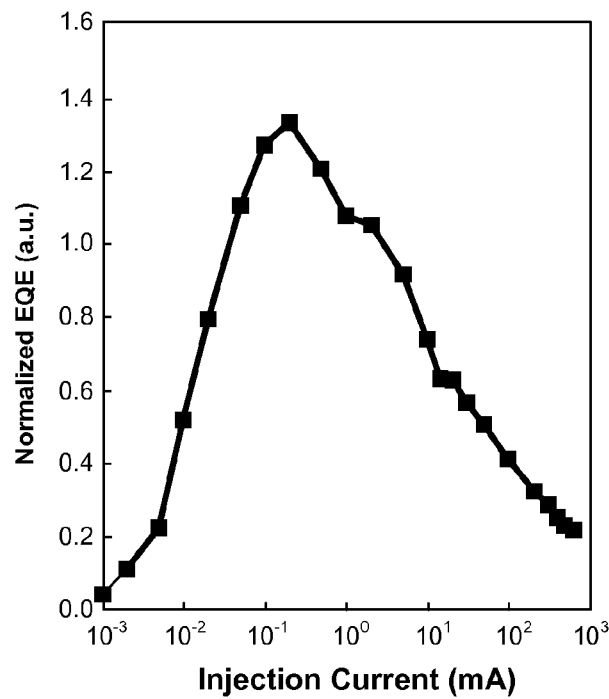
FIG. 1 is a normalized external quantum efficiency versus injection current plot of certain LEDs in accordance with embodiments of the technology.

It has also been recognized that the low quantum efficiencies of the LEDs emitting in longer wavelength ranges are due at least in part to an electrical current "droop" in the LEDs. FIG. 1 is a normalized external quantum efficiency ("EQE") versus injection current plot of example GaN/InGaN LEDs emitting in green wavelength ranges in accordance with embodiments of the technology. As shown in FIG. 1, the GaN/InGaN based LEDs emitting in green wavelength ranges can have high quantum efficiencies (e.g., a peak efficiency of about 65%) at very low current values (e.g., about 0.1 mA in FIG. 1 corresponding to a current density of about 0.11 A/cm$^2$). In comparison, the typical operating current density for LEDs can be in excess of 35 A/cm$^2$. However, as the injection current and corresponding current density increase, the EQE of the LEDs decreases rapidly.

Without being bound by theory, it is believed that several mechanisms may cause the foregoing electrical current "droop" and thus low EQE of LEDs emitting in green wavelength ranges. Even though only the particular mechanisms are described below, the electrical current "droop" may also be caused by other suitable mechanisms not described herein and/or caused by a combination of at least some of the mechanisms.

It is believed that the foregoing electrical current "droop" may be caused by "Auger recombination" when the carrier density (e.g., at high current values) is very high. Under such conditions, an electrons and a hole may recombine and transfer energy to a third carrier (e.g., another electron or hole), thereby moving the third carrier to a higher energy level. After absorbing the energy, the third carrier may lose its excess energy to thermal vibrations. As a result, Auger recombination of the electron and hole does not produce photons but instead produces heat in the crystal lattice structure of the LED.

It is believed that low injection efficiencies of holes may also cause the foregoing electrical current "droop." It is believed that holes are not as mobile as electrons when migrating through a lattice structure in an LED. As a result, the number of holes reaching the active region may be less than the number of electrons. Such excess electrons may then constitute a leakage current which flows through the active region without generating light.

In addition, LED structures typically include crystal defects and/or dislocations. For example, LED structures may include edge dislocations, screw dislocations, and/or other types of dislocations. It is believed that such crystal defects and/or dislocations can create paths where certain carriers can bypass the LED structures without recombining with other carriers. Such bypassing of the carriers can result in low quantum efficiencies.

Transport difficulties of carriers through quantum wells in LEDs can also cause low quantum efficiencies. It is believed that LEDs typically include quantum wells and/or other structures formed on polar or semi-polar crystal planes. The polarity of the crystal planes and/or other structural features of the LEDs can induce energy barriers between the quantum wells, which may restrict the movement of carriers (e.g., electrons and holes) through the quantum wells. As a result, only a small number of quantum wells may be actively undergoing radiative recombination while other quantum wells are idle.

Figure 2:
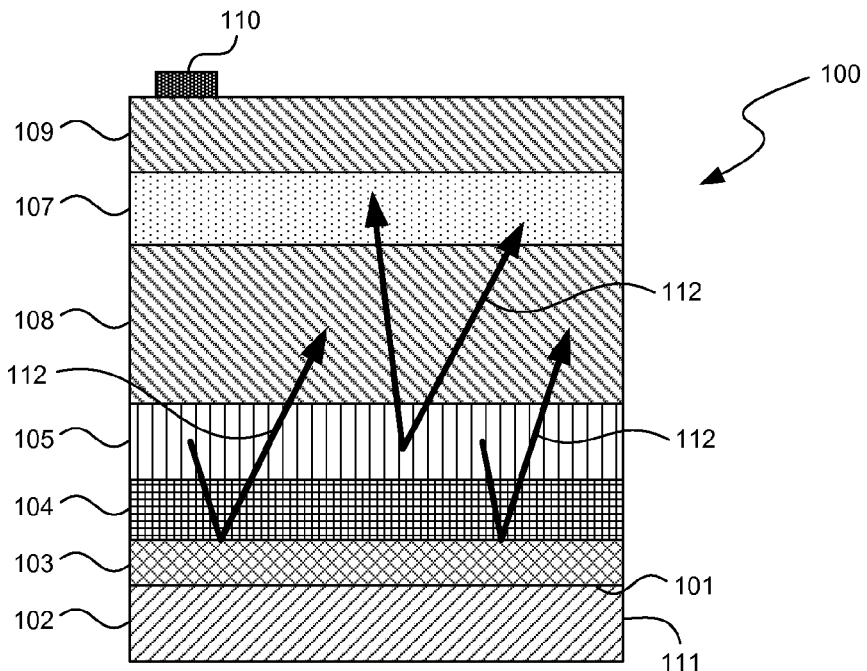
FIG. 2 is a schematic cross-sectional diagram of a light emitting device in accordance with embodiments of the technology.
Figure 3:
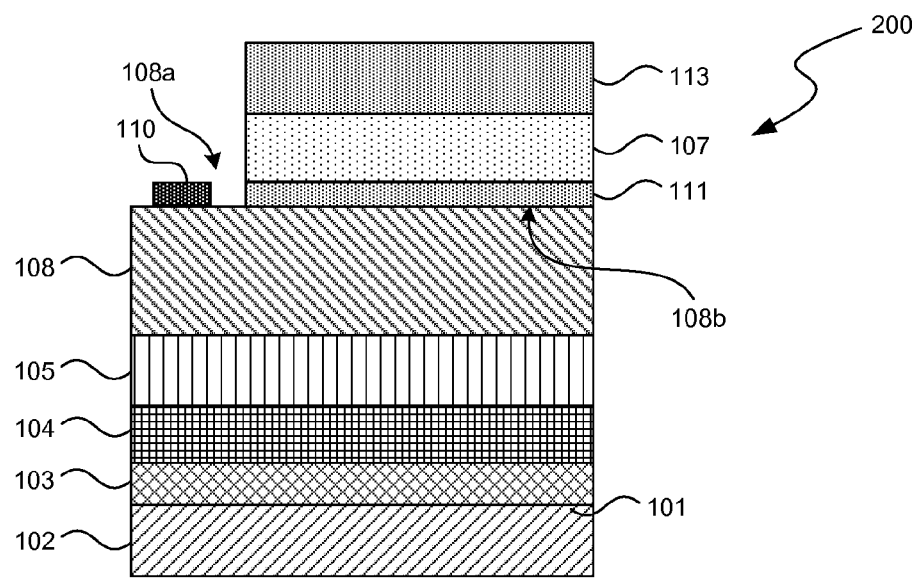
FIG. 3 is a schematic cross-sectional diagram of a light emitting device in accordance with additional embodiments of the technology.
Figure 4:
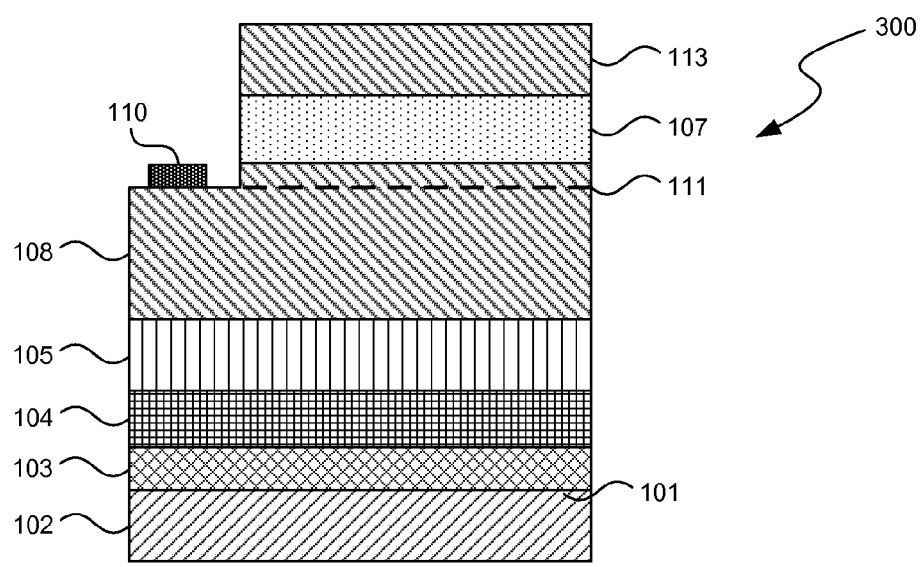
FIG. 4 is a schematic cross-sectional diagram of a light emitting device in accordance with additional embodiments of the technology.

FIGS. 2-4 show several embodiments of light emitting devices that can address at least some of the foregoing issues. FIG. 2 is a schematic cross-sectional diagram of a light emitting device 100 in accordance with embodiments of the technology. In one embodiment, the light emitting device 100 can include a carrier material 102, a first contact 103, a first semiconductor material 104, a first active region 105, a second semiconductor material 108, a second active region 107, a third semiconductor material 109, and a second contact 110.

Even though the light emitting device 100 is shown as having vertically arranged first and second contacts 103 and 120 in FIG. 2, in other embodiments the light emitting device 100 can also have laterally arranged contacts (not shown), buried contacts, and/or other suitable contact configurations. In further embodiments, the light emitting device 100 can also include an optical component (e.g., a collimator), and/or other suitable electrical and/or optical components.

In certain embodiments, the carrier material 102 can be a growth substrate including silicon (Si), at least a portion of which has the Si(1,1,1) crystal orientation, silicon with other crystal orientations (e.g., Si(1,0,0)), gallium arsenide (GaAs), AlGaN, GaN, silicon carbide (SiC), sapphire (Al$_2$O$_3$), zinc oxide (ZnO$_2$), ceramic, a combination of the foregoing materials and/or other suitable materials. In other embodiments, the carrier material 102 can be a support substrate including a dielectric, conductive, or semiconductive material. The carrier material 102 can have a generally planar surface 101 proximate to the first contact 103. In other embodiments, the carrier material 102 may also include a non-planar surface (e.g., having openings, channels, and/or other surface features, not shown).

The first contact 103 can include silver (Ag) or aluminum (Al), and/or other reflective and electrically conductive materials. In the illustrated embodiment, the first contact 103 generally completely covers a surface area of the first semiconductor material 104. In other embodiments, the first contact 103 may partially cover the surface area of the first semiconductor material 104. In further embodiments, the first contact 103 can have a buried configuration and/or other suitable configurations.

The second contact 110 can include gold (Au), copper (Cu), aluminum (Al), and/or other suitable conductive materials. In one embodiment, the second contact 110 includes a plurality of fingers (not shown) coupled to one another by a cross member (not shown). In other embodiments, the second contact 110 can include a point contact. In further embodiments, the second contact 110 can include other suitable contact configurations. The second contact 110 can alternatively be made from a transparent conductive material.

The first and second semiconductor materials 104 and 108 can be configured as cladding structures for the first active region 105. In one embodiment, the first and second semiconductor materials 104 and 108 include an N-type GaN material and a P-type GaN material, respectively. In another embodiment, the first and second semiconductor materials 104 and 108 include a P-type GaN material and an N-type GaN material, respectively. In further embodiments, the first and second semiconductor materials 104 and 108 can individually include at least one of GaAs, aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials. In any of the foregoing embodiments, the first and second semiconductor materials 104 and 108 have opposite doping types.

The first active region 105 can be configured to emit at a first wavelength in the blue, violet, or near-ultraviolet region under electroluminescence. The first active region 105 can include a single quantum well ("SQW"), MQWs, and/or a bulk semiconductor material configured to produce a first emission via electroluminescence. As used hereinafter, a "bulk semiconductor material" generally refers to a single grain semiconductor material (e.g., InGaN) with a thickness greater than about 10 nanometers and up to about 500 nanometers. In certain embodiments, the first active region 105 can include an InGaN SQW, InGaN/GaN MQWs, and/or an InGaN bulk material. In other embodiments, the first active region 105 can include aluminum indium gallium phosphide (AlInGaP), aluminum gallium indium nitride (AlGaInN), and/or other suitable materials or configurations.

The second active region 107 can be configured to emit via only photoluminescence at a second wavelength longer than the first wavelength of the first active region 105. For example, in one embodiment, the second active region 107 can be configured to emit at a second wavelength of about 530 nm, 540 nm, 550 nm, and/or another wavelength in the green region. In other embodiments, the second active region 107 may be configured to emit at other wavelengths in suitable color regions.

The third semiconductor material 109 can have the same doping type as the second semiconductor material 108. For example, both the second and third semiconductor materials 108 and 109 can include one of an N-type GaN material or a P-type GaN material. In further embodiments, the third semiconductor material 109 can include at least one of GaAs, aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials that have the same doping type as the second semiconductor material 108. In any of the foregoing embodiments, the first semiconductor material 104, the first active region 105, the second semiconductor material 108, the second active region 107, and the third semiconductor material 109 can define a light emitting structure formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques.

In operation, an electrical voltage applied between the first and second contacts 103 and 110 injects a first charge carrier (e.g., holes) into the first active region 105 through the first semiconductor material 104 and a second charge carrier (e.g., electrons) into the first active region 105 through the third semiconductor material 109, the second active region 107, and the second semiconductor material 108. The first and second charge carriers recombine in the first active region 105 to emit a first emission at a first wavelength in one of the blue (e.g., about 450 nm to about 500 nm), violet (e.g., about 375 nm to about 425 nm), or near-ultraviolet regions (e.g., about 325 nm to about 375 nm).

The first emission is then reflected by the first contact 103 and/or transmitted through the first semiconductor material 104 and the second semiconductor material 108 to the second active region 107 (as indicated by arrows 112). The second active region 107 absorbs at least a portion of the first emission to generate charge carriers (e.g., electrons and holes) that radiatively recombine to produce a second emission at a second wavelength longer than the first wavelength. In one embodiment, the second wavelength can be in the green wavelength range (e.g., about 495 nm to about 535 nm). In other embodiments, the second wavelength can be in yellow range (e.g., about 545 nm to about 595 nm) and/or other suitable wavelength ranges. Even though the second charge carrier injected from the second contact 110 passes through the second active region 107, the first charge carrier injected from the first contact 103 is not expected to reach the second active region 107 beyond the first active region 105. As a result, the second active region 107 produces the second emission via photoluminescence only, or at least primarily via photoluminescence.

Several embodiments of the light emitting device 100 can at least reduce or eliminate the impact of the foregoing mechanisms that cause inefficiencies. For example, Auger recombination may be reduced in the second active region 107 via controlling the carrier density therein by adjusting the number of quantum wells in the second active region 107. For instance, in one embodiment, by increasing the number of quantum wells, the carrier density may be decreased. In other embodiments, other suitable characteristics of the second active region 107 may be adjusted to achieve the target carrier density.

The injection efficiencies of holes also does not affect the second active region 107 because the emission mechanism in the second active region 107 is photoluminescence. Instead, electrons and holes are created in the second active region 107 by absorbing a portion of the first emission from the first active region 105. No hole injection is thus needed. Further, by creating the electrons and holes in situ, the second active region 107 can have a more uniform charge carrier distribution than an electrically pumped active region.

Another expected advantage of several embodiments of the light emitting device 100 is that carrier bypassing issues due to crystal defects and/or dislocations can also be reduced compared to conventional devices. As shown in FIG. 2, the second active region 107 is spaced apart from the first active region 105 by the second semiconductor material 108. The first active region 105 serves as the junction of the light emitting device 100 where electrons and holes are recombined. Because the second active region 107 is not at a junction, it is expected that there is no significant population of carriers external to the first active region 105 to drive a leakage current. Thus, bypassing issues in the second active region 107 may be at least reduced if not eliminated compared to conventional devices. In certain embodiments, the thickness of the second semiconductor material 108 can be adjusted to restrict or completely block hole migration to the second active region 107. In other embodiments, other suitable parameters of the light emitting device 100 may also be adjusted. Accordingly, embodiments of the light emitting device 100 can emit in green or longer wavelength ranges with higher quantum efficiency and greater wavelength stability than conventional light emitting devices.

Even though the light emitting device 100 shown in FIG. 2 has the second contact 110 on the third semiconductor material 109, in other embodiments the light emitting device 100 can have other configurations. For example, FIG. 3 is a schematic cross-sectional diagram of a light emitting device 200 in accordance with additional embodiments of the technology. As shown in FIG. 3, the light emitting device 200 can include the carrier material 102, the first contact 103, the first semiconductor material 104, the first active region 105, and the second semiconductor material 108 in a stacked arrangement. A first portion 108a of the second semiconductor material 108 of the light emitting device 200 is exposed through a second active region 107. The second contact 110 is in direct contact with the first portion 108a of the second semiconductor material 108 in the light emitting device 200.

The light emitting device 200 also includes a first isolation material 111, the second active region 107, and a second isolation material 113 on a second portion 108b of the second semiconductor material 108 in series. The first and second isolation materials 111 and 113 can include a transparent and generally non-conductive material. In one embodiment, the first and second isolation materials 111 and 113 can include undoped GaN. In another embodiment, the first and second isolation materials 111 and 113 can include silicon oxide (SiO2), silicon nitride (SiN), and/or other suitable isolation materials.

In further embodiments, the first and/or second isolation materials 111 and 113 can also have a composition generally similar to that of the second semiconductor material 108. For example, as shown in FIG. 4, the first and second isolation materials 111 and 113 include N-type GaN. The first isolation material 111 is shown in FIG. 4 as a dashed line for clarity. In yet further embodiments, the first isolation material 111 may be omitted, and the second active region 107 may be formed directly on the second semiconductor material 108.

In the embodiments shown in FIGS. 3 and 4, when a voltage is applied between the first and second contacts 103 and 110, the electrical current flows through the first semiconductor material 104, the first active region 105, and the second semiconductor material 108 without flowing through the second active region 107. As a result, the second active region 107 cannot emit the second emission via electroluminescence but only via photoluminescence.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A light emitting device, comprising:
a first contact, the first contact including a reflective and electrically conductive material;
a first semiconductor material on the first contact;
a second semiconductor material spaced apart from the first semiconductor material;
a first active region between the first and second semiconductor materials, the first active region being configured to produce a first emission via electroluminescence;
a second active region at least proximate the second semiconductor material such that the second semiconductor material is between the first and second active regions, the second active region being configured to absorb at least a portion of the first emission and produce a second emission via photoluminescence;
a third semiconductor material on the second active region; and
a second contact on the third semiconductor material, the second contact including an electrically conductive material, wherein:
the first semiconductor material includes a P-type semiconductor material;
the second semiconductor material includes an N-type semiconductor material; and
the third semiconductor material includes an N-type semiconductor material.

2. A light emitting device, comprising:
a first semiconductor material;
a second semiconductor material spaced apart from the first semiconductor material;
a first active region between the first and second semiconductor materials, the first active region being configured to produce a first emission via electroluminescence;
a second active region at least proximate the second semiconductor material such that the second semiconductor material is between the first and second active regions, the second active region being configured to absorb at least a portion of the first emission and produce a second emission via photoluminescence; and
a third semiconductor material on the second active region, the third semiconductor material and the second material having the same doping type, wherein the first and second active regions individually include at least one of a bulk indium gallium nitride ("InGaN") material, an InGaN single quantum well ("SQW"), and GaN/InGaN multiple quantum wells ("MQWs").

3. A light emitting device, comprising:
a first contact, the first contact including silver (Ag);
a first semiconductor material on the first contact;
a second semiconductor material spaced apart from the first semiconductor material;
a first active region between the first and second semiconductor materials, the first active region being configured to produce a first emission via electroluminescence;
a second active region at least proximate the second semiconductor material such that the second semiconductor material is between the first and second active regions, the second active region being configured to absorb at least a portion of the first emission and produce a second emission via photoluminescence;
a third semiconductor material on the second active region; and
a second contact on the third semiconductor material, the second contact including copper (Cu), wherein:
the first semiconductor material includes P-type gallium nitride ("GaN");
the second semiconductor material includes N-type GaN; and
the third semiconductor material includes N-type GaN.

4. The light emitting device of claim 3 wherein:
the first and second active regions individually include at least one of a bulk indium gallium nitride ("InGaN") material, an InGaN single quantum well ("SQW"), and GaN/InGaN multiple quantum wells ("MQWs");
the first active region having a first composition and a first thickness;
the second active region having a second composition and a second thickness; and
at least one of the first composition and the first thickness is different than the second composition and the second thickness, respectively.

5. A light emitting device, comprising:
a first semiconductor material;
a second semiconductor material spaced apart from the first semiconductor material;
a first active region between the first and second semiconductor materials, the first active region being configured to produce a first emission via electroluminescence;
a second active region at least proximate the second semiconductor material such that the second semiconductor material is between the first and second active regions, the second active region being configured to absorb at least a portion of the first emission and produce a second emission via photoluminescence;
a third semiconductor material on the second active region, the third semiconductor material and the second material having the same doping type;
a first contact; and
a second contact, wherein—
the first semiconductor material is on the first contact, and
the second contact is on the third semiconductor material.

6. The light emitting device of claim 5, wherein:
the first semiconductor material includes a P-type semiconductor material;
the second semiconductor material includes an N-type semiconductor material; and
the third semiconductor material includes an N-type semiconductor material.

7. The light emitting device of claim 5 wherein the first and second active regions individually include at least one of a single quantum well ("SQW") and multiple quantum wells ("MQWs").

8. A light emitting device, comprising:
a first contact;
a second contact spaced apart from the first contact;
a first active region between the first and second contacts, the first active region being configured to produce a first emission via electroluminescence when a voltage is applied between the first and second contacts, the first emission having a first center wavelength;
a second active region spaced apart from the first active region, the second active region being configured to absorb at least a portion of the first emission and produce a second emission via photoluminescence, the second emission having a second center wavelength longer than the first center wavelength; and
a semiconductor material between the first and second active regions, wherein—
the semiconductor material is configured to communicate an electrical current from the second active region to the first active region,
the semiconductor material has a thickness configured to substantially block hole migration from the first active region to the second active region, and
the semiconductor material has a thickness configured to substantially block hole migration from the first active region to the second active region, and
the first and second active regions individually include at least one of a bulk indium gallium nitride ("InGaN") material, an InGaN single quantum well ("SQW"), and GaN/InGaN multiple quantum wells ("MQWs").

9. The light emitting device of claim 8 wherein:
the second active region is between the first and second contacts; and
the second active region is insulated from carrier injection from at least one of the first and second contacts.

10. The light emitting device of claim 8 wherein:
the first center wavelength is in one of the blue, violet, or near-ultraviolet wavelength ranges; and
the second center wavelength is in green wavelength ranges.

11. The light emitting device of claim 8 wherein:
the first center wavelength is from about 450 nm to about 500 nm; and
the second center wavelength is from about 495 nm to about 535 nm.

12. The light emitting device of claim 8
the first center wavelength is about 475 nm; and
the second center wavelength is about 510 nm.

* * * * *

UNITED STATES PATENT AND TRADEMARK OFFICE
CERTIFICATE OF CORRECTION

PATENT NO. : 8,912,554 B2  Page 1 of 1
APPLICATION NO. : 13/156207
DATED : December 16, 2014
INVENTOR(S) : Martin F. Schubert et al.

It is certified that error appears in the above-identified patent and that said Letters Patent is hereby corrected as shown below:

In the Claims

In column 7, line 42, in Claim 5, delete "comprising;" and insert -- comprising: --, therefor.

In column 8, lines 35-37, in Claim 8, after "region, and" delete "the semiconductor material has a thickness configured to substantially block hole migration from the first active region to the second active region, and".

In column 8, line 57, in Claim 12, after "claim 8" insert -- wherein: --.

Signed and Sealed this
Twenty-fourth Day of March, 2015

Michelle K. Lee
*Director of the United States Patent and Trademark Office*